United States Patent
Chu

(10) Patent No.: US 7,372,612 B2
(45) Date of Patent: May 13, 2008

(54) HIGH PERFORMANCE COMPACT EXTERNAL CAVITY LASER (ECL) FOR TELECOMM APPLICATIONS

(75) Inventor: Raymond R. Chu, Cupertino, CA (US)

(73) Assignee: Paxera Corporation, San Jose, CA (US)

( * ) Notice: Subject to any disclaimer, the term of this patent is extended or adjusted under 35 U.S.C. 154(b) by 0 days.

(21) Appl. No.: 10/584,693

(22) PCT Filed: Dec. 23, 2004

(86) PCT No.: PCT/US2004/043357

§ 371 (c)(1),
(2), (4) Date: Jun. 23, 2006

(87) PCT Pub. No.: WO2005/062936

PCT Pub. Date: Jul. 14, 2005

(65) Prior Publication Data

US 2007/0041081 A1    Feb. 22, 2007

Related U.S. Application Data

(63) Continuation-in-part of application No. 10/428,899, filed on May 3, 2003, now Pat. No. 6,930,819.

(51) Int. Cl.
*G02F 1/11* (2006.01)
*G02F 1/33* (2006.01)
*H01S 3/117* (2006.01)
*H01S 3/10* (2006.01)

(52) U.S. Cl. .................... 359/285; 359/310; 372/13; 372/20

(58) Field of Classification Search ................ 359/285, 359/305, 308–314; 372/9, 13, 20, 22, 23, 372/28, 32, 38.01, 92, 98, 99, 102
See application file for complete search history.

(56) References Cited

U.S. PATENT DOCUMENTS

| | | |
|---|---|---|
| 5,734,666 A | 3/1998 | Wada et al. |
| 6,792,010 B2 | 9/2004 | Koulikov et al. |
| 6,959,024 B2 | 10/2005 | Paldus et al. |
| 2002/0018496 A1 | 2/2002 | Gutin et al. |

*Primary Examiner*—William C Choi
(74) *Attorney, Agent, or Firm*—Mupat LLC

(57) ABSTRACT

An optical tunable laser design (100) for the optic telecommunication industry is disclosed in this invention. This new design is economical, reliable, robust and with superior optical performances. The design offers broadband tunability, high output power, narrow laser line-width and high SMSR. And in addition, the tunable laser is distinguishable from conventional designs by the mere facts that there are no moving parts, therefore, making it very reliable, and the tuning method of this invention is non-thermal and non-mechanical making its tuning very fast in the sub-millisecond range. In the manufacturing front, it is low cost and easy to produce. It can be achieved with automation equipment like those used in the IC placement and PC assembly industry, therefore, the products as that disclosed in this invention can be provided with significantly reduced production costs and marketed with very competitive price. The side-mode-suppression ratio (SMSR) is further increased by implementing an etalon (128) having a specific fineness to cooperate with the Acousto-optical tuning filter (AOTF) (120).

28 Claims, 5 Drawing Sheets

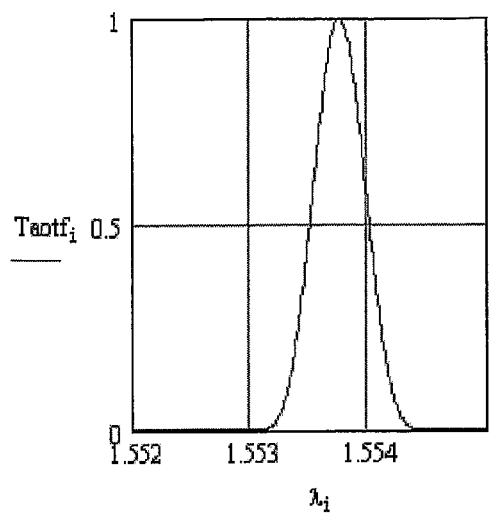
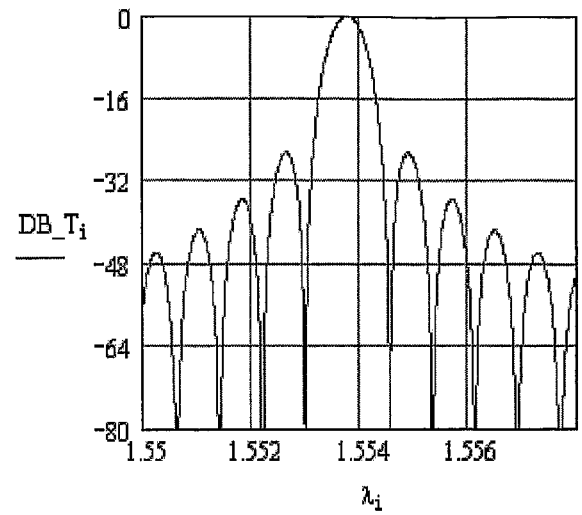
Figure 2A
Figure 2B
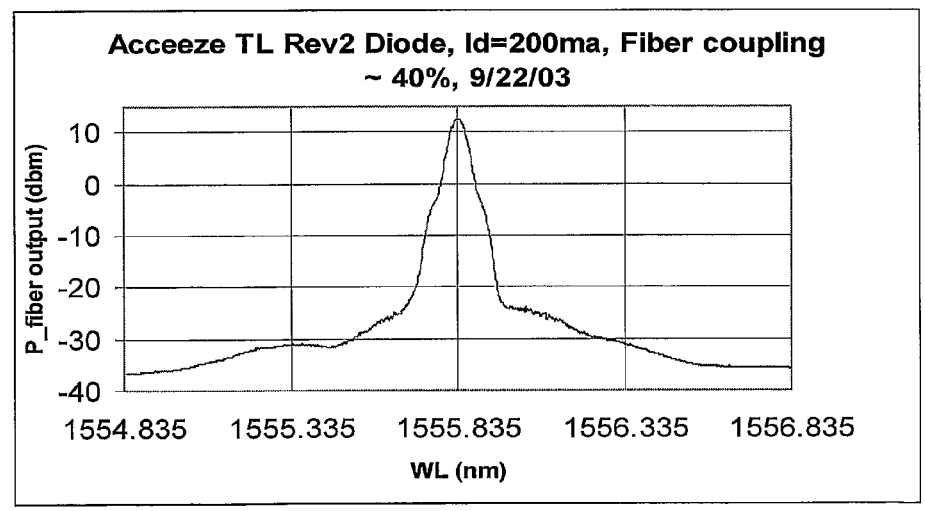
Figure 2C

HIGH PERFORMANCE COMPACT EXTERNAL CAVITY LASER (ECL) FOR TELECOMM APPLICATIONS

This is a Continuous-In-Part (CIP) Application of a previously filed Application with Ser. No. 10/428,899 filed on May 3, 2003, now U.S. Pat. No. 6,930,819 by one of the Applicants of this invention.

FIELD OF THE INVENTION

The present invention relates generally to apparatuses and method for providing tunable laser for optical fiber signal communication systems. More particularly, this invention relates to new configurations and methods for providing external cavity laser (ECL) implemented with acoustic optical tunable filter (AOTF) aided with etalon to achieve high speed and broad range tuning with high side-mode-suppression ratio (SMSR) while providing long term reliable operations under severe operational environments.

BACKGROUND OF THE INVENTION

Conventional technologies of ECL based tunable lasers commonly implemented with mechanical actuators are still confronted with several technical challenges and difficulties due to the limitations of slower tuning speed, susceptibility to environmental vibrations and poor long-term stability/reliability. These shortcomings limit the applications of the ECL based tunable lasers to optical-fiber telecommunication systems. In the meantime, there is an ever-urgent demand to resolve these limitations and difficulties. Another technical difficulty faced by the tunable laser supplier is the requirement of a high side-mode-suppression-ratio (SMSR) that is demanded by the telecommunication industries for the purpose of providing high quality signal transmissions.

Specifically, in fiber telecommunications, tunable lasers are essential to provide system reconfiguration and reprogramming and the key parameters in optical networks are the speed, range, stability, and flexibility of wavelength tuning. Particularly, as digital video, audio and wide varieties of digital data and signals are transmitted via broadband networks, the lack of flexibility in network management becomes an ever-increasing headache for network managers among carriers. As optical network deployment approaches saturation and becomes ever so complicated and expensive, re-deployment and re-configuration become necessary. Therefore, flexible/tunable optical components become essential for next generation optical telecomm equipment. Different network systems implemented with tunable components are being developed currently or in the near future at major equipment makers. Furthermore, future applications may also require a laser with a higher power to compensate the components losses and a narrower line-width to battle with chromatic dispersion. An ECL based laser can potentially meet all these requirements.

Wada et al. disclose in U.S. Pat. No. 573,466 entitled "Method for Selecting Wavelength in Wavelength-tunable Lasers and Laser Oscillators Capable of Selecting Wavelengths in Wavelength-Tunable Lasers", a laser resonator with a mirror on the input side and output side. A laser medium is placed in the resonator and can be oscillated in a predetermined range of wavelengths. A crystal to which is piezoelectric element is attached, the crystal receiving acoustic waves from the piezoelectric element in accordance with a desired wavelength; and a polarizing plate which is placed in the laser resonator and transmits only the output light beam having a prescribed plane of polarization or having a prescribed direction of light propagation among the output light beams from the laser medium. The apparatus thereby outputs only the desired wavelength. The tunable lasers disclosed by Wada et al. is limited by using a collinear configuration of the AO crystal, in which an acoustic wave and light wave propagate along the same direction that has shown very limited usefulness in the technology fields of telecommunication. The filtering line-width produced by such laser is very wide, much wider, e.g., an order of magnitude wider, than the channel spacing of 0.2 nm of a 25 Ghz spaced telecom tunable laser or 0.4 nm for a 50 Ghz spaced telecom tunable laser. And the size of the crystal would likely be an order of magnitude longer then a size that would fit into a miniaturized tunable laser package suitable to be implemented in the modern telecommunication systems. Furthermore, Wada's tunable laser is still limited by the inherent characteristics of an Acousto-optical filter that there will be wavelength shifts introduced by the acoustic wave. If a backward path is applied, there would be double shifts and the tunable laser as disclosed by Wada et al. would not be able to sustain a viable oscillation suitable for application in modern telecommunication systems.

Gutin disclosed in a Patent Application 20020018496, entitled "Tunable Diode Laser System Apparatus and Method", a tunable laser system wherein the tuning of the laser is accomplished by a micro-mirror array (MMA) formed as two-dimensional linear array of micro-mirrors manufactured by applying the micro-electromechanical system (MEMS) technologies. Due to the limitation of the speed of movements of the micro-mirrors, the tuning speed of the diode laser system is limited to a microsecond range, in actuality, with electronic servos and complicated servo and tuning algorithms, the tuning speed can hardly reach below the millisecond barrier as most of the MEMS based switching components have demonstrated. Furthermore, potential problems associated with moving parts, such as problems of long-term reliability and stability, also hinder practical applications of the diode lasers as disclosed by Gutin in the fiber network systems that demand a high level of reliability and stability over long term operations.

Another difficulty of the ECL based tunable lasers is a critical problem with mode hopping and it often limits the manufacturability in terms of cost and yield, and in most cases, becomes its limiting factor for optical and tuning performances. It is much more difficult to make an ECL-based laser provided with an operational feature to tune continuously across the entire optical telecommunications bands. It is often discretely tunable only on the ITU grids. The mechanism of mode hoping can be understood with a phenomenon that the selected laser cavity mode corresponding to the longitudinal oscillation wavelength and the narrow-band filter mode corresponding to a center wavelength do not align with each other. The mode hopping problem results in a competition of adjacent laser cavity modes, both allowable within the narrow-band filter line-width that leads to the laser cavity to be in an unstable state thus causing an alternating oscillation. Such a problem is unavoidable if in a tunable ECL laser, the only tuning mechanism is the tuning of filter center frequency, as in the cited configurations of the referenced patents. In most ECL-based tunable lasers, often more then one tuning mechanisms are implemented where the motions are coordinated for continuous tuning without mode hope. That is the reason why it becomes very difficult and costly to provide an ECL-based tunable laser with continuously tunable capability over the entire optical band.

For these reasons, an ECL based laser when limited by the technical difficulties even with several performance advantages, the conventional ECL-based lasers are still of limited usefulness for application to the fiber networks. Therefore, a need still exists in the art of optical fiber system and component manufacturing and design, particularly those related to ECL-based lasers, to provide new and improved system and component configurations and designs to overcome the above-mentioned technical difficulties and limitations.

SUMMARY OF THE PRESENT INVENTION

It is therefore an object of the present invention to provide a tunable laser for the optical telecommunication industry that is economical, reliable, robust and with superior optical performances such that the above mentioned limitations and difficulties can be resolved. Specifically, it is an object of this invention to provide a tunable laser with no moving parts for the fiber networks that offers broadband tunability, high output power, narrow laser line-width and high SMSR, and highly reliable. Furthermore, the method of tuning laser as disclosed in this invention is non-thermal and non-mechanical such that the tuning speed is in the microsecond range.

Furthermore, it is the object of this invention to provide high-speed tunable laser with a configuration that is convenient to manufacture and can be produced economically at a relatively low cost. Specifically, the manufacturing process can be performed with highly automated processes as that applied in the electronic industries for IC packaging and printed circuit board assembly processes. The tunable lasers of this invention can be produced with competitive price to a fixed wavelength laser in the same industry and can be practically implemented in wide ranges of optical fiber networks for telecommunication applications.

It is another object of this invention to provide an ECL-based tunable laser that further includes a telecom grade, high finesse etalon in the external cavity. The etalon can be added before the AOTF after a collimating lens or after the AOTF before the reflection mirror for reducing the effects of further reducing the filter bandwidth, (or relaxing the requirement of AOTF bandwidth, therefore reducing further the size of the AO crystal) the side ripples of the AOTF outside of the pass band to achieve better side-mode-suppression ratio (SMSR) of the tunable laser to satisfy higher performance requirements as demanded in the telecommunication industry.

Briefly, in a preferred embodiment, the present invention discloses an external cavity tunable laser. This external cavity tunable laser includes an external cavity tunable laser that includes a frequency-tuning device configured as an Acousto-optical cell including a first and a second acousto-optical diffraction means having a narrow-band optical filtering Bragg grating. The external cavity tunable laser further includes an etalon for narrowing further the AOTF bandwidth and suppressing side-mode ripples generated from the Acousto-optical cell. In a preferred embodiment, the etalon is placed right before the Acousto-optical cell and in another preferred embodiment; the etalon is placed right after the Acousto-optical cell. In a specific embodiment, the etalon has an optical fineness substantially around 10 or higher. In another preferred embodiment, the first Acousto-optical diffraction means includes a first Acousto-optical crystal and the second Acousto-optical diffraction means includes a second Acousto-optical crystal. The external cavity tunable laser of further includes a reflection mirror driven by a PZT assembly to reflect a beam projected from the Acousto-optical cell back to transmit therethrough again. The external cavity tunable laser further includes a first electrode connected to the first Acousto-optical diffraction means and a second electrode connected to the second Acousto-optical diffraction means. The first and second Acousto-optical diffraction means having diffraction phase gratings for intra-cavity narrow-band wavelength filtering and the first electrode is connected to an RF signal for tuning a central frequency of the narrow band Bragg grating the second electrode is connected to a second electric source to provide a second order filtering for compensating a wavelength shift.

In a preferred embodiment, this invention further discloses an external cavity tunable laser that includes an etalon disposed next to a frequency-tuning device configured as an Acousto-optical cell and a reflection means for forward and backward transmitting an optical beam through the Acousto-optical cell for generating an optical beam with zero-wavelength shift and at least twice filtered by the Acousto-optical cell. In another preferred embodiment, the etalon having an optical fineness substantially around 10 or higher. In a preferred embodiment, the Acousto-optical cell further includes a first and a second Acousto-optical crystal. In another preferred embodiment, the Acousto-optical cell further includes a first and a second Acousto-optical diffraction means disposed in an Acousto-optical crystal. In another preferred embodiment, the Acousto-optical cell further includes a first and a second Acousto-optical diffraction columns respectively disposed in an Acousto-optical crystal.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 2A and 2B are waveform diagrams for showing the pass band filtering function and the side-mode ripples of the Acousto-optical filter as implemented in FIG. 1;

FIG. 2C is a waveform diagram for showing the pulse shape of an output optical signal generated from the ECL of FIG. 1;

DETAILED DESCRIPTION OF THE INVENTION

Figure 1A:
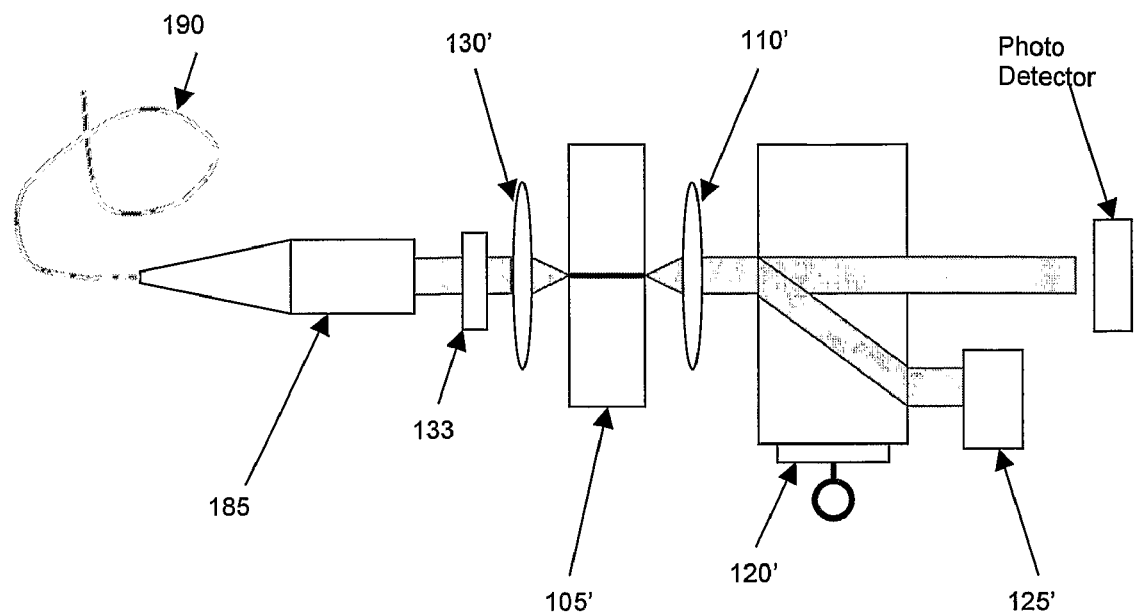
FIG. 1A is a schematic functional block diagram for showing an external-cavity laser (ECL) based Acousto-optically tuned laser of this invention.
Figure 1B:
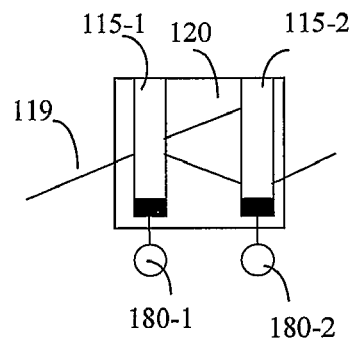
FIGS. 1B is schematic diagrams for showing an Acousto-optical filter of this invention that may be implemented respectively as dual crystal or dual column optical cells.

FIG. 1A shows a functional block diagram for a tunable laser 100 based on External Cavity Laser (ECL) technology. The tunable laser is acousto-optically tuned with wide tuning range. The laser can be continuously tuned or discretely tuned at 25 Ghz and 50 Ghz spacing on the standard ITU grid when integrated with a wavelength locker. The tunable laser as it is configured now can cover easily 100 channels (40 nm) and is provided to move down to 12.5 Ghz spacing in the future. The tunable laser includes a laser diode chip 105 to function as a light source. The laser diode chip 105 is a Fabri-Perot chip laser with broadband, IR emission spectrum. In a specific embodiment, the laser diode 105 is an anti-reflection coated fabric-perot laser diode. The laser diode 105 has its left surface as an output reflector (front facet), its right surface is the AR coated surface (rear/back facet). The diode acts as a broadband gain block. The light emitted form the diode is collimated by lens 110 and incident at the AOTF filter 120 at its Bragg's AO interaction angle. It is the gain cell of ECL laser resonator that is commonly applied in ECL configuration for emitting laser beam to pass through a first collimating lens 110 to project the laser beam onto a main frequency-tuning device 120. As shown in FIG. 1B, the frequency-tuning device 120 is configured as an acousto-optical cell that includes two crystals. The acousto-optical crystals have a narrow-band optical filtering Bragg grating. After passing through the acousto-optical cell 120, the laser beam is projected to a high reflection mirror 125 driven by a PZT assembly to reflect the beam back to the acousto-optical frequency-tuning cell 120 again to project through the first collimating lens 110 and a second collimating lens 130. The collimated beam is then projected through an optical isolator 133 to a fiber pigtail 185 for generating an output optical laser beam from the output optical fiber 190. The tunable laser 100 of this invention as configured in FIG. 1A is an ECL-based tunable laser that has the advantages of high output power, narrow laser oscillation line-width, superior mode quality and high Side Mode Suppression Ratio (SMSR), low RIN noise, and low manufacturing costs.

The disclosures of the AOTF 120 was previously made in two other co-pending patent applications Ser. No. 10/428,899 filed on May 3, 2003 and Ser. No. 10/455,151 filed on Jun. 4, 2003 by a common inventor of this Patent Application and the patent application Ser. Nos. 10/428,899 and 10/455,151 are hereby incorporated by reference in the present Patent Application.

Referring to FIG. 1B for the frequency-tuning AOTF 120 configured as an Acousto-optical cell that includes two crystals 115-1 and 115-2. The Acousto-optical crystals have a narrow-band optical filtering Bragg grating. Two electrodes 180-1 and 180-2 are connected to the Acousto-optical crystals 115-1 and 115-2 to control the frequency-tuning function of these two AO crystals. The Acousto-optical crystals are provided with diffraction phase gratings for intra-cavity narrow-band wavelength filtering (namely AOTF: Acousto-optical-tunable-filter). Specifically, both crystal cells are aligned to the Bragg's angles for high diffraction efficiency in the first order diffraction. As further described in more details in the co-pending patent application Ser. No. 10/455,151, the AOTF of this invention is implemented with a non-collinear AO design in which the acoustic wave propagates almost perpendicular to the lightwave, therefore, this AOTF is enabled to take advantage of the high frequency diffraction effect to achieve narrow filtering bandwidth while using a very small crystal size (<5 mm in length). Furthermore, by using a second crystal as disclosed or a second column as shown, the frequency shift is corrected with the second crystal or crystal column functioning as a second AOTF. The gratings can also be implemented as Surface Acoustic Wave (SAW) grating and the tunable filter can be implemented as a SAW-based tunable filter. The SAW grating is similar to that of the embodiments as shown above instead the surface acoustic wave (SAW) grating is reflective. The center optical frequency of the Acousto-optical gratings is tuned electrically by means of RF signals. The second crystal is implemented as a second order filter and also as a wavelength shift compensator. Therefore, the double pass through the second order optical narrow-band filter will result in superb optical oscillation line-width. As oppose to other designs of AOTFs that are large and inefficient in terms of power consumption, the AOTF design implemented is much smaller in size and consumes as little as <200 mw of RF power. Thus, this enables the integration of the AOTF into a telecomm standard 14pin-butterfly package (1"×½"×½") for industrial use. Further studies indicate the tuning range can be as high as 120 nm covering 300 channels of the 50 Ghz spacing ITU grid. With high-speed electronics, the tuning speed is in the order of microseconds. The improvements of the tuning speed described above are achieved because, unlike the conventional technologies, the turning speed of the AOTF is no longer the limiting factor. Compared to the conventional systems tuned by MEMS or thermal tuning elements the AOTF of is invention can provide higher tuning speed. Therefore, the tuning speed of the tuning electronics such as the locking speed of the phase lock loop (PLL) of an RF source now becomes the limiting factor of the tuning speed, and for this reason, the tuning speed is significantly improved.

The Acousto-optical (AO) crystals 115-1 and 115-2 are acting as volume gratings. When driven by an RF signal, the crystal lattice oscillates in accordance with the frequency of the RF signal resulting periodical variation of optical refractive index of the crystal. The physical length of a period (pitch) defines the grating's diffraction resolution as that of the fixed pitch grating, and is related to the frequency of the RF signal and the acoustic wave traveling speed inside of the crystal, the faster the speed, the longer the grating pitch. On the other hand, the oscillation strength defines the diffraction efficiency and that relates directly to the product of driven signal strength (RF power) and the AO crystal's Figure of Merit. The higher the Figure of Merit, the lower the driven RF power needed for the same level of AO grating diffraction efficiency. In addition to the general properties of regular volume gratings, the AO crystal gratings do provide means for very high efficiency of first-order diffraction. It is because of the nature that, the wave vectors of the traveling acoustic wave, incident optical wave and the diffracted optical wave must satisfy the phase matching condition according to the Braggs law of diffraction. Therefore, with proper design of the crystals, this invention makes use of the highly efficient property of the first-order diffraction as a narrow band optical filter.

Because of a traveling wave nature of the AO diffraction grating, the diffracted light is frequency shifted by the amount of the acoustic frequency. The direction of the shift is dependent upon the relative direction of the acoustic wave and the incident light wave and can be understood by the analogy of Doppler Shift. The resonant cavity are implemented with two crystals for practical applications, in order to reduce the production costs, the two crystals are manufactured as one crystal with two cells as one preferred embodiment implemented in one of the products based on the configuration disclosed in this invention. When the first order diffraction from the first crystal enters into the second crystal it is frequency-shifted. Again the shift is a first order diffraction shift but with an opposite frequency shift after the second crystal. This double diffracted light results in a zero net frequency shift.

To a specific crystal, the Figure of Merit defines its responsiveness to a driven RF signal. For meaningful Acousto-optical interactions, high Figure of Merit crystals are of interests, these include crystals composed of Lithium Niobate ($LiNbO_3$), Tellurium Dioxide ($TeO_2$), etc. And with RF excitation, two acoustic oscillation modes exist that derives different applications. These modes are longitudinal mode and share mode (transverse mode), and are dependent on the cut orientation relative to crystal principle axes. For Tellurium Dioxide, which is one of the preferred embodiments of this invention, the longitudinal mode is relative easy to excite and with fast acoustic speed. It has low acoustic attenuation but relatively low Figure of Merit, and therefore, requires relatively high RF power. In share mode, its velocity is very slow which results in very high, e.g., easily by 2 orders of magnitudes, Figure of Merit. Therefore, a share mode $TeO_2$ is used as the crystals for configuring the Acousto-optical filter. Other than these materials discussed above, for the purpose of implementing this invention, any birefringent crystals that have high Acousto-optical Figure of Merit may be employed to form the AOTF.

For the purpose of overcoming the difficulties of mode hopping, two moving mechanisms are provided. One is tuned with RF frequency to tune the AO crystals 115-1 and 115-2 and the other with a piezo-electric actuator for driving the reflection mirror 125. In the meantime, for the consideration of tuning speed, the moving range of the piezo-electric actuator needs only to cover the +/−¼ of free-spectrum range of the cavity mode, which is about +/−0.4 um. Therefore, with the design, as disclosed in this invention, the tunable laser as now configured can be a high speed tunable laser that is virtually mode hope free.

At each ITU grid (an optical frequency), the AOTF is set to the optical frequency by means of applied RF signals. However, the cavity length and its effective refractive index define the cavity resonant mode, e.g., optical frequency, natural resonant mode. The cavity resonant mode is not necessarily aligned to the center frequency of the AOTF. The filtered laser resonant mode is the result of the competition between the AOTF center frequency and the natural resonant modes of the laser cavity. And when the center frequency of AOTF moves to near the middle of two nearby natural resonant modes during tuning, the resonant mode will become "unstable" as being one of the two competing results of the neighboring modes with the pass band center frequency of the AOTF. Mode hope occurs, which is described as the laser oscillation mode hopes from one mode to the adjacent. The end result is abrupt discontinuity of laser power and wavelength. With the use of PZT, the reflection mirror can be moved. Therefore, when the AOTF is tuned to an ITU grid, the PZT can be adjusted to move the natural resonant cavity mode to the center of the AOTF pass band thus eliminating the instabilities, and ensuring a mode hope free operation at the ITU grid.

Referring to FIGS. 2A and 2B for waveform diagrams showing the AOTF pass band pulse and a side-mode ripples of the AOTF 120. FIG. 2C shows the pulse shape of the output laser that is measured to have ~2 Mhz linewidth, ~40 db SMSR as shown in FIG. 2C. It is understood a relatively high side-mode level, e.g., −40 db down, is related to the side ripples of the AOTF as shown in FIG. 2B, which is intrinsically a SINC function. Due to the side ripples of the AOTF laser modes outside of the AOTF pass band as shown in FIG. 2B that also resonates yielding sloped declines in the lasing spectrum as shown in FIG. 2C. The side ripple effect thus limits the side-mode-suppression-ratio (SMSR) required for high performance lasers in the telecomm industry. For the purpose of increasing the side-mode-suppressing-ratio (SMSR) it is still required to reduce the side-mode ripples.

Figure 3:
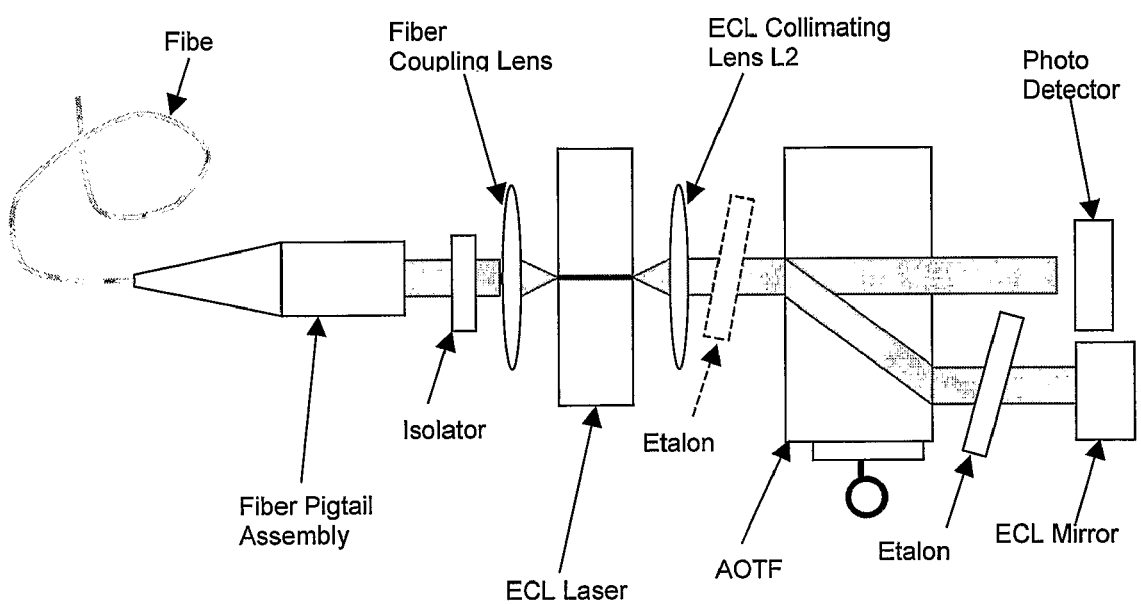
FIG. 3 is a schematic diagram of an alternate preferred embodiment of this invention implemented with an Acousto-optical tunable filter and an etalon for side-mode suppression.

FIG. 3 is a schematic diagram for showing an alternate embodiment of the ECL system 200 for further improving the performance of the laser source to achieve a performance level with the SMSR >50 db and a frequency stability <1 GHz. The ECL laser 200 as shown in FIG. 3 further provides an advantage that the laser source can be manufactured with a more compact package because of a reduced length as that required for the AOTF 120. The ECL laser 200 has a configuration essentially the same as FIG. 1A with the exception that an Etalon 128 is added right after the AOTF 120. With the addition of a telecom grade, high finesse etalon 128 added into the external cavity of the design as shown in FIG. 1A achieves the design objective of reducing the side-mode ripples as will be further described below. The etalon can be added before the AOTF 120 after the collimating lens110 or after the AOTF 120 before the reflection mirror 125. FIG. 3 depicts such a design diagram, where one of the added etalon 128' is shown with dashed lines to indicate that either positions of before or after the AOTF are optional. Furthermore, in FIG. 3, the etalon 128 is placed with tilted angle none-normal to the incident beam. This is to avoid reflecting the unfiltered signal back into the laser cavity, in other words, creating much higher loss for the unwanted wavelengths.

Figure 4A:
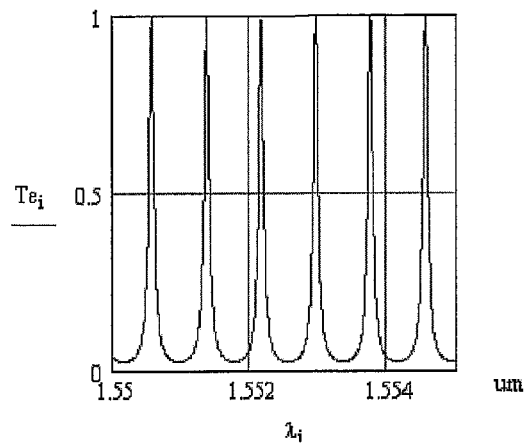
FIGS. 4A and 4B are waveform diagrams for showing the spectrum characteristics of an etalon implemented in FIG. 3.
Figure 4B:
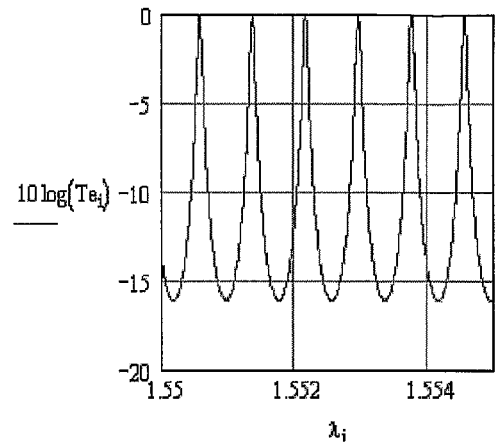

With an addition of a high finesse etalon 128 that is disposed either before or after the AOTF 120, FIGS. 4A and 4B show the spectrum characteristics of a 100 Ghz spaced (free spectrum range) etalon of finesse 10. The etalon 128 is also aligned to the telecom ITU frequency grid. This can be easily achieved by vary its substrate temperature slightly via a TEC. The etalon can be spaced to any frequency spacing as needed for other applications in addition to telecommunication.

Figure 5A:
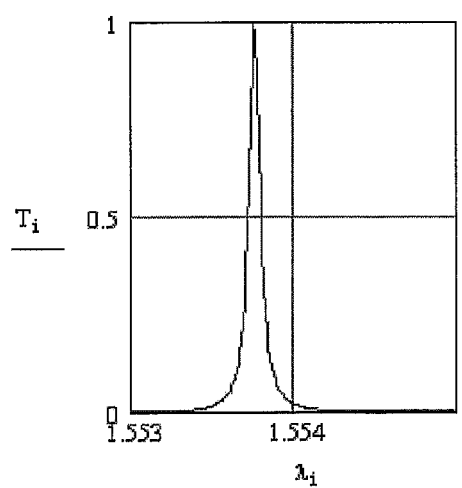
FIGS. 5A and 5B are waveform diagrams for showing the pass band filtering function and the reduced side-mode ripples of the Acousto-optical filter when etalon of FIG. 3 is implemented.
Figure 5B:
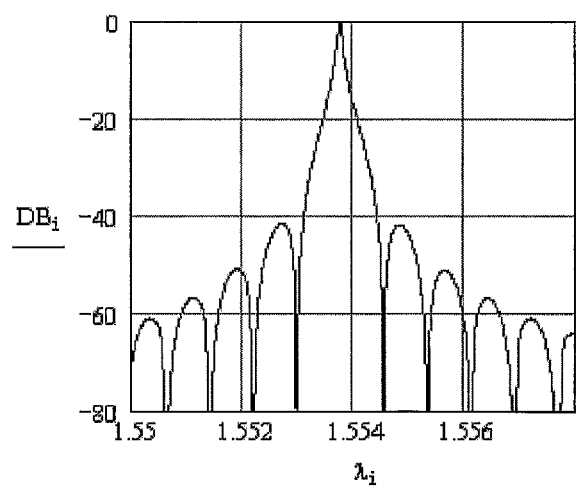

When AOTF's center frequency as that shown in FIG. 2A with the central frequency aligned to the one particular etalon mode, it results in the combined filter line shape shown in FIGS. 5A and 5B. Compared to FIG. 2B, the side ripple of the AOTF suppressed from about −28 db to <−45 db by the high rejection of the etalon, a 17 db improvement. The side-mode-suppression-ratio (SMSR) as achieved by the tunable laser 200 can easily achieve a performance level that SMSR >55. The system as disclosed now can achieve even a higher SMSR by employing an etalon of a higher fineness, e.g., fineness >10. A comparison between FIG. 2A and 5A shows a drastic improvement in the AOTF 3 db bandwidth from 0.5 nm to ~0.1 nm. Given that the etalon 128 is aligned to the telecom ITU grid, the tuning of the laser becomes none-continuous. It is by change the RF frequency applied to the AOTF such that its pass band is aligned to a particular etalon mode. FIGS. 5A and 5B depicts such a tuning mechanism.

Figure 6:
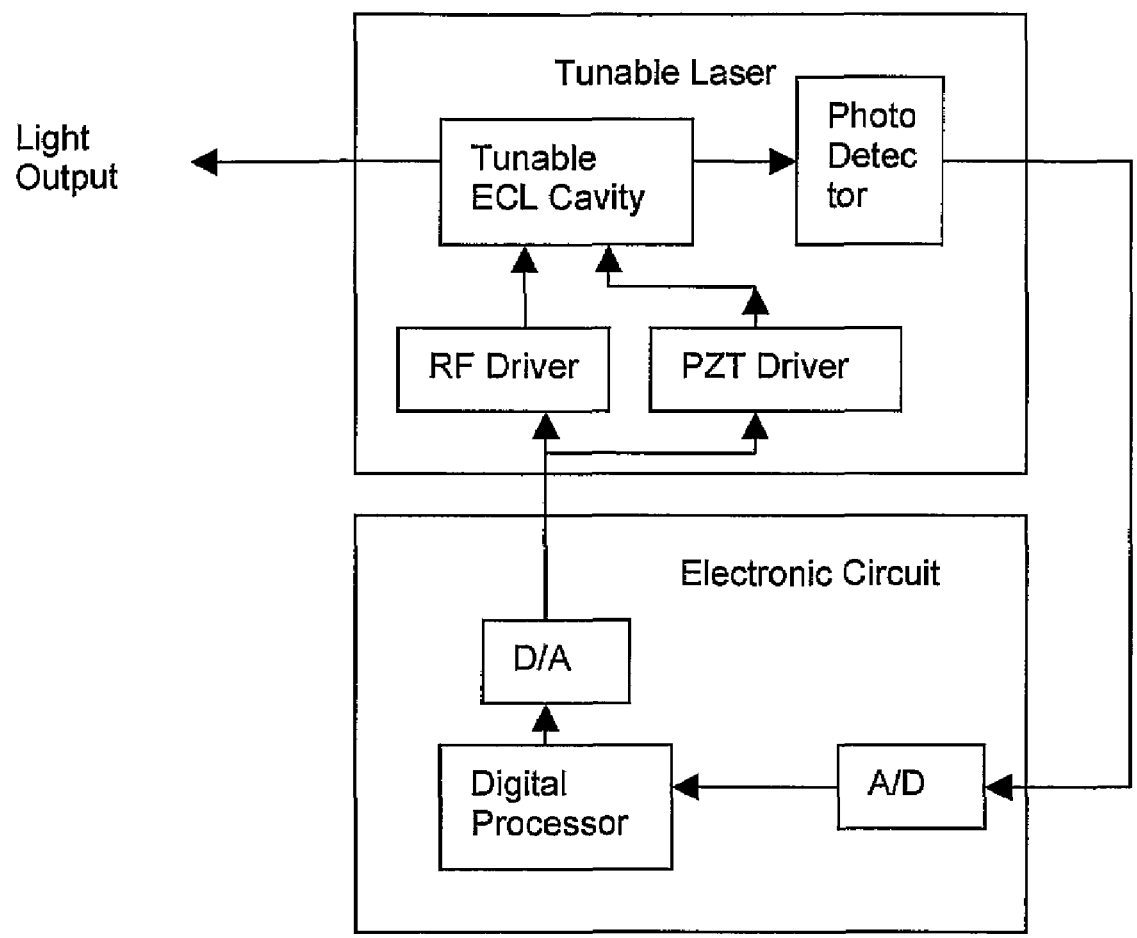
FIG. 6 is a functional block diagram for showing a control scheme to take advantage of the discrete tuning capabilities as provided by the ECL system disclosed in the present invention.

The ECL laser 200 as shown has additional advantage because of the implementation of a very narrow and compact etalon 128. It is no longer a stringent requirement to use a narrow band-pass AOTF 120. Therefore, the length of the AOTF 120, which determines partly the line-width of the AOTF filter 120 can be reduced to yield a much more compact tunable laser package. Furthermore, with a none-continuous discrete tuning operation to each of the etalon modes, the wavelength stability of the laser is determined by the stability of the etalon 128. When wavelength drifts away from the center of the etalon peak, lasing power reduces. By monitoring the laser power through dithering the PZT/mirror assembly, one can track the wavelength drift relative to the etalon peak by moving PZT or maximum laser power being monitored. Therefore, a closed-loop wavelength stabilization method can be use to further improve the tunable laser wavelength (frequency) stability. FIG. 6 shows such a control loop. Such a control mechanism also applies to centering AOTF pass-band to its center.

The above design and improvements apply equally well to a single column AOTF based ECL tunable laser. Given the very high gain of a semiconductor laser chip, a single column AOTF is sufficient to produce strong feedback for ECL based lasing in light of the AOTF induced frequency shift. This has been experimentally proven and tested. Apparently the gain is high enough and the lasing bandwidth is wide enough that although the feedback light, through a round trip of the AOTF, is frequency double shifted by the acoustic frequency, it is still falls inside and laser ECL gain bandwidth and is able to excite the energy elevated electrons to maintain a resonant oscillation. However such a laser exhibits poor side mode suppression, wide spectrum linewidth, and low output power as compared with a frequency shift compensated one such as the one discussed above.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. An external cavity tunable laser comprising:
    a frequency-tuning device configured as an Acousto-optical cell including a first and a second Acousto-optical diffraction means having a narrow-band optical filtering Bragg grating; and
    an etalon having spectral characteristics for cooperating with said frequency-tuning device to increase a side-mode suppression ratio of said tunable laser.
2. The external cavity tunable laser of claim 1 wherein:
    said etalon having a finesse greater than or equal to 10.
3. The external cavity tunable laser of claim 1 wherein:
    said etalon is spectrally aligned with a telecommunication ITU grid.
4. The external cavity tunable laser of claim 1 wherein:
    said etalon is disposed immediately before said frequency tuning device along an optical path of said tunable laser.
5. The external cavity tunable laser of claim 1 wherein:
    said etalon is disposed immediately after said frequency tuning device along an optical path of said tunable laser.
6. The external cavity tunable laser of claim 1 wherein:
    said first Acousto-optical diffraction means comprising a first Acousto-optical crystal and said second Acousto-optical diffraction means comprising a second Acousto-optical crystal.
7. The external cavity tunable laser of claim 1 further comprising:
    a reflection mirror driven by a PZT assembly to reflect a beam projected from said Acousto-optical cell back to transmit therethrough again.
8. The external cavity tunable laser of claim 1 further comprising:
    a first electrode connected to said first Acousto-optical diffraction means and a second electrode connected to said second Acousto-optical diffraction means.
9. The external cavity tunable laser of claim 8 wherein:
    said first electrode is connected to an RF signal for tuning a central frequency of said narrow band Bragg grating.
10. The external cavity tunable laser of claim 8 wherein:
    said second electrode is connected to a second electric source to provide a second order filtering for compensating a wavelength shift.
11. The external cavity tunable laser of claim 1 wherein:
    said first and second Acousto-optical diffraction means having diffraction phase gratings for intra-cavity narrowband wavelength filtering.
12. The external cavity tunable laser of claim 1 further comprising:
    a collimated laser source for projecting a collimated optical signal of specific wavelength through said Acousto-optical cell.
13. The external cavity tunable laser of claim 1 wherein:
    said first and second Acousto-optical diffraction means are formed as a first column and a second column respectively in a single Acousto-optical crystal.
14. The external cavity tunable laser of claim 1 wherein:
    said first and second Acousto-optical diffraction means are formed as a first column and a second column respectively in a Lithium Niobate ($LiNbO_3$) crystal.
15. The external cavity tunable laser of claim 1 wherein:
    said first and second Acousto-optical diffraction means are formed as a first column and a second column respectively in a Tellurium Dioxide ($TeO_2$) crystal.
16. The external cavity tunable laser of claim 1 wherein:
    said first and second Acousto-optical diffraction means are formed as a first column and a second column respectively in a birefringent crystal having a pre-defined responsiveness to an radio-frequency (RE) driven signal.
17. The external cavity tunable laser of claim 1 wherein:
    said first and a second Acousto-optical diffraction means having said narrow-band optical filtering Bragg grating further comprising a surface acoustic wave (SAW) grating.
18. An external cavity tunable laser comprising:
    a frequency-tuning device configured as an Acousto-optical cell and a reflection means for forward and backward transmitting an optical beam through said Acousto-optical cell for generating an optical beam with zero-wavelength shift and at least twice filtered by said Acousto-optical cell; and
    an etalon for cooperating with said frequency-tuning device to increase a side-mode-suppression-ratio of said tunable laser wherein:
    said etalon having a finesse greater than or equal to 10.
19. The external cavity tunable laser of claim 18 wherein:
    said etalon is spectrally aligned with a telecommunication ITU grid.
20. The external cavity tunable laser of claim 18 wherein:
    said etalon is disposed immediately after said frequency tuning device along an optical path of said tunable laser.

21. The external cavity tunable laser of claim 18 wherein:
said Acousto-optical cell further comprising a first and a second Acousto-optical crystal.

22. The external cavity tunable laser of claim 21 wherein:
said Acousto-optical cell further comprising a first and a second Acousto-optical diffraction means disposed in an Acousto-optical crystal.

23. The external cavity tunable laser of claim 21 wherein:
said Acousto-optical cell further comprising a first and a second Acousto-optical diffraction columns respectively disposed in an Acousto-optical crystal.

24. The external cavity tunable laser of claim 21 wherein:
said first and second Acousto-optical cells are formed as a first column and a second column respectively in a birefringent crystal having a predefined responsiveness to an radio-frequency (RF) driven signal.

25. The external cavity tunable laser of claim 21 wherein:
said first and a second Acousto-optical cells having said narrow-band optical filtering Bragg grating further comprising a surface acoustic wave (SAW) grating.

26. An external cavity tunable laser comprising:
a frequency-tuning device configured as a non-collinear Acousto-optical cell having an acoustic wave propagates almost perpendicular to an optical transmission therethrough; and an etalon cooperating with said frequency-tuning device for increasing a side-mode-suppression-ratio of said tunable laser.

27. A method for tuning a laser comprising:

tuning said laser by a frequency-tuning device configured as a non-collinear Acousto-optical cell having an acoustic wave propagates almost perpendicular to an optical transmission therethrough; and employing an etalon of a specific finesse to cooperate with said frequency-tuning device for outputting an optical signal with an increased a side-mode-suppression-ratio (SMSR).

28. The method for tuning a laser of claim 27 further comprising:

forming said frequency-tuning device as a first and a second Acousto-optical diffraction cells and employing said etalon with a finesse equal to or greater than 10.

* * * * *